United States Patent [19]
Bhatia et al.

[11] 3,955,210
[45] May 4, 1976

[54] ELIMINATION OF SCR STRUCTURE

[75] Inventors: Harsaran Singh Bhatia, Wappingers Falls; Gerald Dennis O'Rourke, Poughkeepsie, both of N.Y.; Siegfried K. Wiedmann, Stuttgart, Germany

[73] Assignee: International Business Machines Corporation, Armonk, N.Y.

[22] Filed: Dec. 30, 1974

[21] Appl. No.: 537,511

[52] U.S. Cl. .................... 357/42; 357/43; 357/48; 357/52; 357/86
[51] Int. Cl.² .......................... H01L 27/02
[58] Field of Search .............. 357/38, 41, 42, 43, 357/48, 52, 86

[56] References Cited
UNITED STATES PATENTS

| | | | |
|---|---|---|---|
| 3,673,428 | 6/1972 | Athanas | 357/42 |
| 3,712,995 | 1/1973 | Steudel | 357/42 |
| 3,798,512 | 3/1974 | Critchlow et al. | 357/41 |
| 3,806,371 | 4/1974 | Barone | 357/42 |
| 3,916,430 | 10/1975 | Heunter et al. | 357/42 |

OTHER PUBLICATIONS

H. Kalter, "Bipolar and FET Integration on a Common Chip," IBM Tech. Discl. Bull., Vol. 15, No. 12, May 1973, pp. 3755–3756.
W. Dennehy, "Non-Latching Integ. Ckts.," R.C.A. Tech. Notes, No. 876, 2-12-71, pp. 1–4.

*Primary Examiner*—Andrew J. James
*Assistant Examiner*—Joseph E. Clawson, Jr.
*Attorney, Agent, or Firm*—Thomas F. Galvin

[57] ABSTRACT

A complementary field effect transistor structure which eliminates the problems caused by parasitic currents between devices. The currents are contained within parasitic bipolar devices formed between the various regions of the FETs. A portion of the collector current of the parasitic bipolar devices is drained away so that the loop gain is less than one. This is achieved by placing guard regions of conductivity type which are the same as the channel type of the transistors adjacent said regions. The guard region is preferably in the form of a continuous ring around its associated FET.

11 Claims, 5 Drawing Figures

ELIMINATION OF SCR STRUCTURE

BACKGROUND OF THE INVENTION

1. Field of the Invention

This invention relates to complementary field effect transistors fabricated as integrated circuits.

2. Description of the Prior Art

The applications of CMOS type circuits in low power and relatively low speed systems such as calculators, portable data buffers, small computers, etc., are by now well known. Such devices have enjoyed considerable commercial success. However, where it has been desired to integrate such devices in highly dense fashion in a single semiconductor substrate, designers in the field have encountered a stumbling block which has not been overcome heretofore.

In the conventional structure, an N channel device is formed in a P region and a P channel device is formed in an N region adjacent said P region. P type contacts are made in the P region and N type contacts are made in the P region in the area between the active N and P channel devices. Such a structure is shown, for example, in U.S. Pat. No. 3,712,995 in the name of G. W. Steudel. In highly dense circuits where such devices are separated by no more than the few microns, a four-region PNPN structure is thereby formed. Under normal operating conditions as an FET circuit, this structure may function as a silicon-controlled rectifier (SCR) which, under some circumstances, becomes latched and remains so. This results in a malfunction of the field effect transistors, rendering the circuits inoperative.

Heretofore, semiconductor designers have avoided this problem in commercial intergrated circuits by spacing the field effect transistors far enough apart within the chip so that parasitic circuits are negligible. However, such low circuit densities make the CMOS family of circuits less desirable than other competitive technologies such as bipolar and single channel integrated circuit field effect transistors. Other devices are commercially available in which the problem has not been solved. Careful control of the input and power supply potentials is required to avoid latchup in such devices.

The parasitic problem is now recognized as the principal factor which has limited the packing density of CMOS devices. It overshadows the limitations previously associated with integrated circuit techniques — excessive heat dissipation and the inability during fabrication to accurately define the individual regions within the semiconductor chip.

SUMMARY OF THE INVENTION

Accordingly, it is an object of this invention to increase the density of CMOS integrated circuits by solving the problem of parasitics.

It is a further object of this invention to fabricate such improved structure economically and using standard techniques.

In accordance with our invention, the active P and N channel devices as well as the contact regions formed for operation with these devices are segregated from one another by a pair of guard regions. The guard regions must be of the same conductivity type as the active devices adjacent them, i.e, the P type guard region is adjacent the P channel device and the N channel guard region is adjacent the N channel device.

These regions serve to reduce the gain of the parasitic devices to a sum of less than one, thereby preventing SCR action. A portion of the collector current of the parasitic NPN and PNP devices which might cause SCR action is drawn off so that the loop gain is less than one.

The foregoing and other objects, features and advantages of our invention will be appreciated from the following more particular description of the preferred embodiments of the invention, as illustrated in the accompanying drawings.

DESCRIPTION OF THE PREFERRED EMBODIMENT

Figure 1:
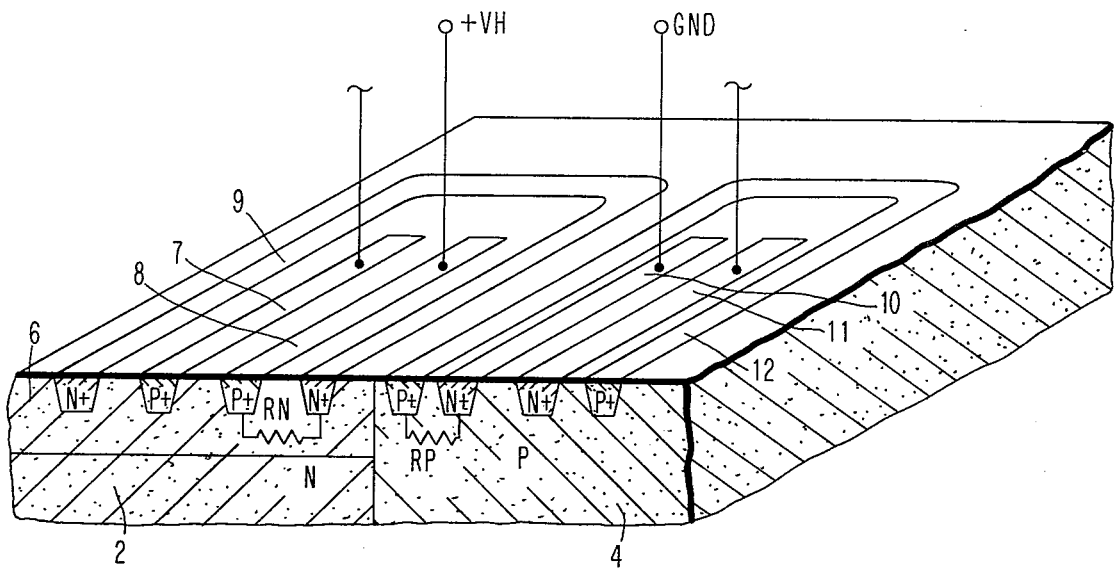
FIG. 1 illustrates a complementary field effect of standard design available commercially.

In FIG. 1 there is shown the prior art CMOS structure which is susceptible to parasitic latchup when fabricated in high density fashion on an integrated circuit semiconductor chip. The circuit in FIG. 1 comprises a P channel and an N channel field effect transistor formed in a semiconductor substrate 2. For clarity and ease of illustration, the metallization and insulation layers required on the surface of the chip to form an operative circuit are not shown.

The P channel device comprises source and drain regions 7 and 8, respectively, formed in an N type epitaxial layer 6. Surrounding these regions is an N+ diffusion 9 which has served as a guard ring to prevent parasitic currents as well as a contact region to the surface of the chip.

The N channel transistor is formed in P pocket region 4 and comprises source and drain regions 10 and 11, respectively. P+ region 12 serves both as a guard ring for the N channel transistor as well as a contact diffusion from the surface of the chip to region 4.

In the conventional circuit operation as a CMOS FET the regions are biased as illustrated. The guard regions may float or be connected to appropriate bias potentials when used as substrate contacts. In the P channel transistor, P+ region 8, acting as a source, is biased positively at VH with respect to P+ region 8 which acts as a drain. N+ region 9 serves as a contact to N substrate region 2. In the N channel transistor, N+ region 10, acting as a source, is biased at ground. P+ region 12 serves as a contact to P pocket region 4. Suitable interconnections between these regions are commonly made from surface metallization (not shown). Commonly, as in a standard CMOS FET inverter, P+ drain 7 and N+ drain 11 are connected in common at the output mode. Upon provision of control signal means at the gate electrodes (not shown), operative circuits are completed.

As will be obvious to semiconductor designers, the terms source and drain are more or less interchangeable when discussing integrated circuit field effect transistors. In CMOS circuits, it is common to refer to the active region of the P channel device which is biased most positively as the source and to refer to the active region of the N channel device which is biased most negatively as the source. We have followed this convention, although our invention is not limited to such fine distinctions.

As previously mentioned, the structure of FIG. 1 corresponds to that of devices which are presently commercially available. Their fabrication is at present well known to those of skill in the art. In these commercial devices, the transistors are spaced far enough apart within the semiconductor chip so that parasitic currents are not a significant problem.

In commercial devices, for example, the spacing between both P+ region 8 and P region 4 as well as N region 6 and N+ region 10 must be much wider than that which can be achieved with modern fabrication techniques; and such low densities make the CMOS family of circuits less desirable than bipolar devices and single channel FET's. In other instances, commercial CMOS devices are available in which the spacings are too small; and unless the bias potentials are carefully controlled, which is quite often impractical, such devices become inoperative.

Figure 2:
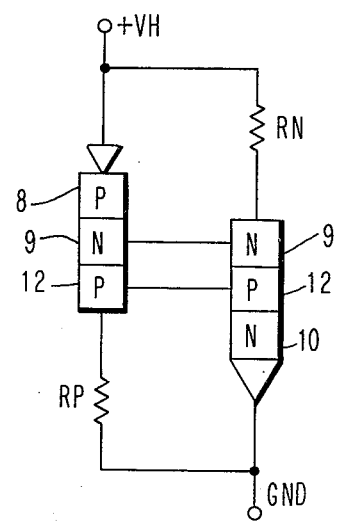
FIG. 2 is an equivalent circuit of a PNPN (SCR) structure which may result from the CMOS structure of FIG. 1.

FIG. 2 illustrates the circuit problem arising in the CMOS structure of FIG. 1 if the spacing between the heavily doped P+ and N+ regions is inadequate. When the devices are in close proximity, the heavily doped regions enumerated as 8, 9, 10 and 12, which form a four layer PNPN structure, operates as an SCR. Resistors RN and RP, illustrated in FIG. 1 as resistances in the bulk of layer 6 and pocket 4, respectively, complete the equivalent circuit of the two-transistor silicon controlled rectifiers (SCR) shown in FIG. 2.

For ease of comprehension, the regions comprising the SCR circuit of FIG. 2 are enumerated identically to their corresponding regions in the CMOS structure of FIG. 1. Thus, P region 8 forms the anode and N region 10 the cathode of the SCR. N region 9 and P region 12 are the intermediate layers. Viewed as a two-transistor structure, regions 8, 9 and 12 comprise the emitter, base and collector of a PNP transistor, respectively; and regions 9, 12 and 10 comprise the collector, base and emitter of an NPN transistor. Potential VH is directly connected to P region 8 and through resistor RN to N region 9. Ground potential is directly connected to N region 10 and through resistor RP to P region 12.

In operation as an SCR, i.e., when the aforementioned regions are in close proximity, the anode and cathode junctions are bypassed by resistors RN and RP, respectively. If a transient pulse in base 12 causes the NPN transistor to turn on, the current could bias base 9 of the PNP transistor. The latter transistor may then start to conduct current which may, in turn, bias base 12 of the NPN transistor. Thus, each transistor acts to render the other conductive; and this self-generating action may cause the SCR circuit to remain latched if the loop gain of the circuit is greater than one.

In terms of the device equations, if (1) $\beta_{NPN} \cdot \beta_{PNP} \geq 1$ each transistor drives the other into saturation, all junctions assume a forward bias, the total potential drop across the SCR approximates that of a PN junction, plus the terminal characteristics of a saturated transistor ($V_{BE} + V_{CESAT}$) and anode current is limited only by the external circuit. If this problem is to be avoided, the loop gain must be held to less than one:

(2) $\beta_{NPN} \cdot \beta_{PNP} < 1$

One possible solution is to reduce the values of resistances RN and RP to a level such that the transistors never succeed in turning on.

This solution is obviously impractical in high density CMOS integrated circuits because it would require more contacts to P pocket 4 and to the substrate 6, thereby reducing the feasible density of the circuits.

Alternatively, the P and N channel devices could be separated by wide distances to prevent SCR action by, in effect, attenuating the parasitic currents to negligible values. This, too, means reduced circuit density.

Our solution to the problem allows circuit density to be at the level desired in the industry, subject only to the limitations of conventional fabrication techniques in reducing the dimensions of the separations between the various regions in the integrated circuit structure. As noted above, our basic philosophy is to drain away part of the collector current of the parasitic NPN and PNP devices so that the loop gain is always less than one. We achieve this by separating the active FET devices with guard regions which must be of the same conductivity type as the conductivity type of the transistors next adjacent them. Thus, both N and P type guard regions are placed in the area separating the opposite conductivity type transistors, the N region being closest to the N channel transistor and the P region being closest to the P channel transistor.

Figure 3:
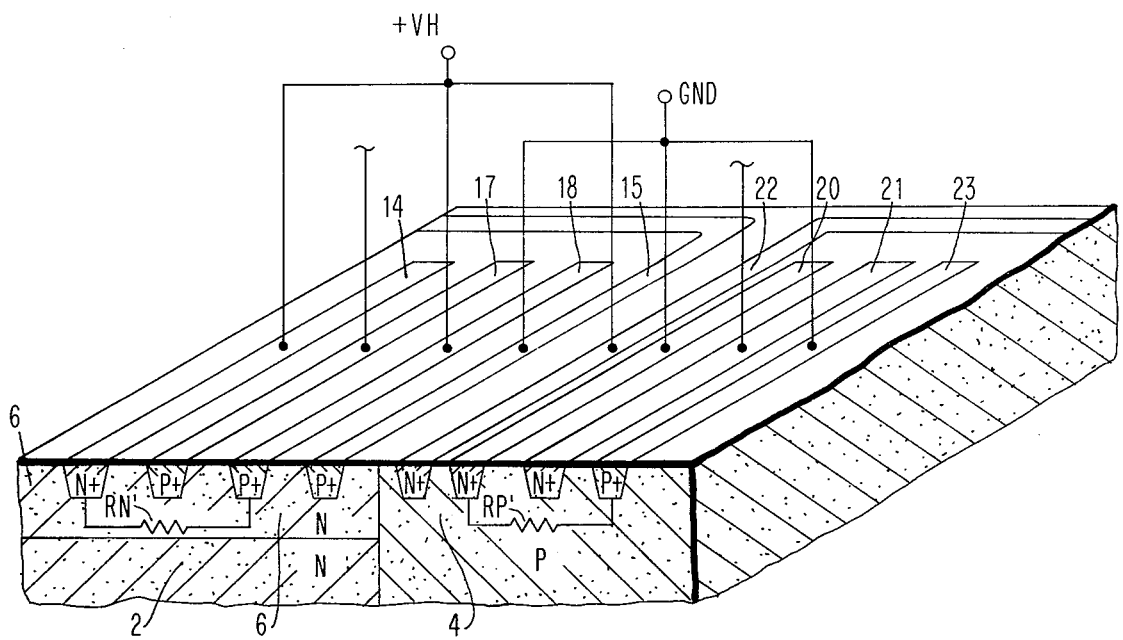
FIG. 3 illustrates a novel CMOS structure according to our invention.

FIG. 3 illustrates the preferred embodiment of our novel structure. As with the circuit illustrated in FIG. 1, the circuit comprises a CMOS FET formed in a semiconductor substrate 2, the metallization and insulation layers required on the surface of the chip not being shown for ease of illustration.

The P channel device comprises source and drain regions 17 and 18, respectively, formed in N type epitaxial layer 6. Associated with the P channel device is an N+ type region 14 which serves as a contact to layer 6.

The N channel transistor is formed in P pocket region 4 and comprises source and drain regions 20 and 21, respectively. Associated with the N channel transistor is a P+ type diffusion 23 which serves as a contact to P pocket 4.

The area of the chip separating the P and N channel transistors contains a P+ region 15 and an N+ region 22 each in the form of an annulus around its associated transistor contact region in accordance with our invention. The connections to the active regions of the field effect transistors from the two sources of potential VH and ground are the same as in FIG. 1. In addition, bias potentials are supplied to guard regions 15 and 22, with VH being connected to region 22 and ground connected to region 15. Substrate contacts 14 and 23 are connected to VH and ground, respectively, in the conventional manner. Although substrate contacts 14 and 23 are illustrated as being remote from guard regions 15 and 22, respectively, they might also be placed between their respective field effect transistors and guard regions. Such placement would have no effect on the operation of our novel structure in eliminating SCR action.

Regions 6, 18, 20 and 4 in FIG. 3 form a four layer PNPN structure. Resistors RN' and RP' illustrated in FIG. 3 as resistances in the bulk of layer 6 and pocket 4, respectively, complete an equivalent circuit of a two-transistor device. However, the provision of P region 15 and N region 22, appropriately biased, effectively reduce the loop gain of the potential SCR so that it can never latch.

Figure 4:
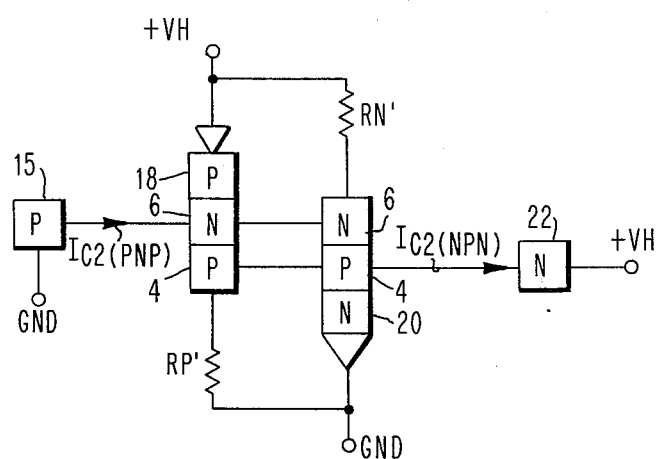
FIG. 4 is an equivalent circuit of a PNPN structure which may result from our novel structure as well as the regions which prevent the PNPN structures from acting as an SCR.

This is better understood by reference to FIG. 4 where P region 18 forms the anode and N region 20 the cathode of the potential SCR. N region 6 and P region 4 are the intermediate layers. Regions 18, 6 and 4 comprise the emitter, base and collector of a PNP transistor, respectively; and regions 6, 4 and 20 comprise the collector, base and emitter of an NPN transistor, respectively. P type guard region 15 is connected to the ground potential as well as to N region 6. N type guard region 22 is connected to positive potential VH as well as to P region 4.

In operation, assume that the NPN transistor is turned on, say because of a transient pulse at base 4. A portion of the collector current from base 4 to collector 6 is instead collected by N region 22 and drained off at VH. This provides less base current for base 6 of the PNP transistor, and it tends to turn on less than it would; and not go into saturation. Even if the PNP device were turned on, region 15 acts as a secondary collector for the PNP transistor; and less current flows from collector 4 which could initiate base current in base 4 of the NPN transistor.

Thus, regions 15 and 22 function as secondary collectors for the PNP and NPN transistors, respectively. In the presence of the secondary subcollectors the emitter current, $I_E$, of either transistor is divided into $I_{C1}$ and $I_{C2}$. Only $I_{C1}$ provides base current to the other transistor which tends to intiate SCR action. This reduced parasitic base current is also divided in the other transistor.

Again with respect to FIG. 4, assume that a transient causes the NPN transistor to become conductive, and emitteer current $I_E$ begins to flow. This current is divided into $I_{C1}$ and $I_{C2}$, flowing into collector 6 and secondary collector 22. Because only $I_{C1}$ provides base current for the parasitic PNP at region 6, the PNP device has less tendency to turn on. Even if the PNP device were turned on, its emitter current is divided between regions 4 and 15, providing less base current at base 4 for regenerative action in the NPN transistor. Thus, at this point there is less current than there was initially, the transient dies out, and SCR action does not occur.

Guard regions 15 and 22 are preferably, but not necessarily, wholly within their respective bulk substrate areas 6 and 4. Region 15, for example, may overlap into area 4 without detriment because both are biased at ground. Similarly, region 22 may overlap into area 6. It is even possible to join regions 15 and 22 at the intersection of areas 4 and 6. However, such overlap would be limited by the breakdown potential of the P+N+ junction so formed.

The important result of our invention is the reduction in spacing between adjacent diffused regions now possible. The spacing is now limited only by state of the art fabrication techniques, which is presently around 4 microns.

Figure 5:
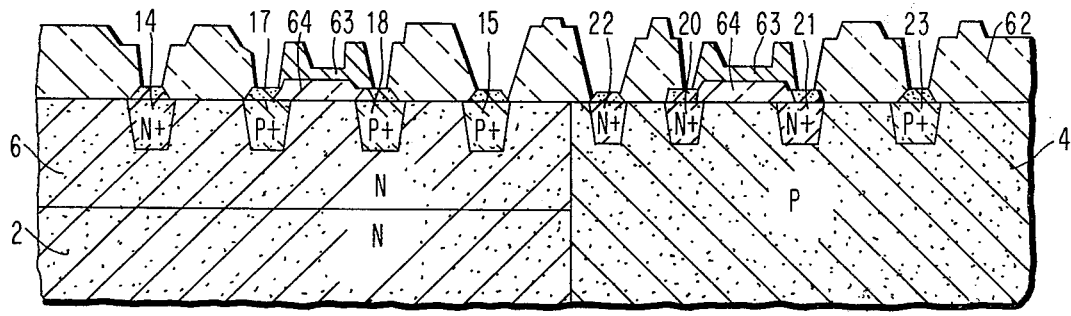
FIG. 5 illustrates a CMOS structure in accordance with our invention which has been fabricated in accordance with standard modern fabrication techniques.

FIG. 5 illustrates a CMOS FET structure fabricated in accordance with our invention, with the ohmic contacts and metallization layers omitted. N type substrate 2 is preferably oriented in the <100> crystallographic direction and has a resistivity of from 1.8 to 2.4 ohm-cm. P pocket 4 is preferably doped with boron which is selectively diffused into substrate 2 and outdiffused during the deposition of epitaxial layer 6. The pocket is completed by a diffusion or ion implantation of boron into the surface of the epitaxial layer so that the outdiffused boron from the substrate 2 and the surface diffusion from the epitaxial layer 6 join to form pocket 4. Arsenic has the most desirable properties as the impurity in the epitaxial layer 6, although phosphorus is also acceptable.

The active regions of the field effect transistors as well as the substrate contact regions are formed by conventional photolithographic and diffusion techniques. The space between regions 18 and 15, for example, are around 4 microns.

A simple technique which also reduces the number of process steps and masks which may be used comprises forming all of the N type regions simultaneously, with the areas where the P type regions are to be formed masked to prevent diffusion. This is followed by the reverse procedure with the N regions masked and the P regions formed through openings in the mask.

Such techniques have already been described in the literature and are well known in the art. Therefore, they form no part of our invention, but merely illustrate the ways of implementing our novel CMOS FET structure.

While the invention is particularly shown and described with reference to preferred embodiments thereof, it will be understood by those skilled in the art that the foregoing and other changes in form and details may be made therein without departing from the spirit and scope of the invention.

For example, numerous techniques are available for the formation of the regions of the device. In addition, while the preferred process comprehends the outdiffusion of P type material into an N type epitaxial layer to form a P pocket, obviously an N type pocket may be formed in a P type epitaxial layer with a corresponding reversal of the conductivity types of the active regions. Moreover, any process for forming a region of one conductivity type within a substrate of another conductivity type to provide a pocket or well for one transistor, the other transistor being formed outside the pocket, is acceptable.

We claim:
1. In an integrated circuit device which includes a body of semiconductor material of a first type of conductivity and a pair of insulated gate field effect transistors adjacent a surface thereof, one of which has spaced source and drain regions of conductivity type opposite to said first type in said body, and the other having a pocket region of said opposite type conductivity and a pair of source and drain regions of said first type conductivity within said pocket region, the improvement comprising:
   guard regions of said first and opposite conductivity types separating said field effect transistors, the guard region of said first conductivity type being located adjacent the field effect transistor having source and drain regions of said first conductivity type and the guard region of said opposite conductivity type being located adjacent the transistor having source and drain regions of said opposite conductivity type;

means for connecting said first-conductivity-type guard region and said opposite-conductivity-type drain region to a first bias potential; and means for connecting said opposite-conductivity-type guard region and said first-conductivity-type source region to a second bias potential.

2. An integrated circuit device as defined in claim 1 wherein said first-conductivity-type guard region is located wholly within said pocket region and said opposite-conductivity-type guard region is located wholly outside said pocket region.

3. An integrated circuit device as in claim 1 further comprising:

first and second contact regions of said first and opposite conductivity types, respectively, disposed within said semiconductor body and said pocket region, respectively;

said first contact region connected to the same bias potential as said opposite-conductivity-type drain region;

said second contact region connected to the same bias potential as said first-conductivity-type source region.

4. An integrated circuit device as in claim 3 wherein the spacing between said guard region and their adjacent field effect transistor is around 4 microns.

5. An integrated circuit device as defined in claim 1 wherein said first type conductivity is N type and said opposite type conductivity is P type.

6. A integrated circuit device as defined in claim 5 wherein said N type guard region is located wholly within said pocket region and said P type guard region is located wholly outside said pocket region.

7. An integrated circuit device as in claim 5 further comprising:

N and P type contact regions disposed within said semiconductor body and said pocket region, respectively;

said N type contact region connected to the same bias potential as said P type drain region;

said P type contact region connected to the same bias potential as said N type source region.

8. An integrated circuit device as in claim 7 wherein the spacing between said guard regions and their adjacent field effect transistors is around 4 microns.

9. In a complementary insulated gate field effect transistor integrated circuit including P and N channel transistors disposed in contiguous semiconductor regions of N and P type conductivity, respectively, and P and N type contact regions disposed in said P and N type contiguous regions, respectively, and further including a first bias potential applied to the drain region of said P channel transistor and said N type contact region, and a second bias potential applied to the source region of said N channel transistor and said P type contact region, respectively, the improvement comprising:

N and P type guard regions disposed between said transistors, the N type guard region being located adjacent the N channel field effect transistor and the P type guard region being located adjacent the P channel transistor, said first and second bias potentials being connected to said N and P type guard regions, respectively;

said guard regions thereby acting as collectors of parasitic currents which flow between said transistors.

10. A complementary field effect transistor integrated circuit as in claim 9 wherein said N type guard region is located wholly within said pocket region and said P type guard region is located wholly outside said pocket region.

11. An integrated circuit device as in claim 10 wherein the spacing between said guard regions and their adjacent field effect transistors is around 4 microns.

* * * * *